United States Patent [19]

Larson

[11] Patent Number: 4,498,177
[45] Date of Patent: Feb. 5, 1985

[54] M OUT OF N CODE CHECKER CIRCUIT

[75] Inventor: Brian R. Larson, Eagan, Minn.

[73] Assignee: Sperry Corporation, New York, N.Y.

[21] Appl. No.: 412,487

[22] Filed: Aug. 30, 1982

[51] Int. Cl.$^3$ .............................................. H03K 13/32
[52] U.S. Cl. ....................................... 371/52; 364/783
[58] Field of Search ..................... 364/783; 371/48, 52

[56] References Cited

U.S. PATENT DOCUMENTS

2,907,526 10/1959 Havens ................................. 364/783
3,196,260 7/1965 Pugmire ............................. 371/52 X
3,638,184 1/1972 Beuscher et al. ................. 371/52 X

Primary Examiner—Jerry Smith
Assistant Examiner—Mark Ungerman
Attorney, Agent, or Firm—William C. Fuess; Kenneth T. Grace; Marshall M. Truex

[57] ABSTRACT

An N bit input word is partitioned into parts, preferably N/3 parts of 3 bits each. Each part is counted in parallel for the number of binary ones contained therein in first stage parallel code generators, preferably in N/3 parallel berger code generators each producing on 2 binary encoded signal lines that number of binary ones as are contained within 3 input signal lines. The binary encoded signal lines from the parallel code generators are added in a second stage binary tree of adders, such adders as are used in conjunction with first stage berger code generators progressing from N/6 adders of 2 bits width at level 1 to 1 adder of $\ln_2(N/3)+1$ bits width at level $\ln_2(N/3)$. The final adder produces $(X+1)$ binary encoded signals representing the number of binary ones contained within the input word, $2^{X+1} \geq N$. A final comparator stage based on exclusive OR gates and an OR gate(s) compares the $X+1$ signals representing the actual bit count with an equal number of binary encoded signals representing the then desired number M, $M \leq N$, and produces an error signal if the number of binary ones detected is not equal to M. A preferred embodiment implementation of the berger code generator circuits utilizes exclusive OR logical elements based on the CMOS technology transfer gate structure.

7 Claims, 8 Drawing Figures

M OUT OF N CODE CHECKER CIRCUIT

BACKGROUND OF THE INVENTION

The present invention relates to electronic digital logical circuitry, and, in particular, to a method and a circuit for the checking of the M out of N (M less than N) fixed-weight code which is useful in detecting error occurring during digital data transfers, communications, and storage.

An M out of N code (M less than N) is a fixed-weight code with a fixed number (M) of ones and a fixed number (N minus M) of zeros out of a total number (N) of word bits, or lines. The M out of N codes are useful because they can detect all unidirectional errors. Useful application for these codes are in digital data transfers, communications and storage. Additionally, these codes have been utilized in the arithmetic sections of digital computers, including the 2 out of 7 code in the IBM 650 and a 2 out of 5 code in the IBM 7070.

A check circuit for an M out of N code detects any single bit or unidirectional multibit error in an input, control, word. For an error to be undetected by such a check circuit, there must be an equal number of zero goes to one errors as one goes to zero errors. Fortunately, the probability of such offsetting error conditions is usually extremely small. An M out of N code checking circuit is defined to be "self-checked" whenever an error indiction will be derived whenever the input does not have the requisite N out of M bits set, or whenever a fault occurs with the logic of the checker circuit itself.

In general, prior art code checkers are comprised of AND and OR gate logics and assume a multiplicity of forms dependent upon which N out of which M is specified to be checked. One code checker of regular form is for checking for N/2 out of N bits. This is, of course, a restricted case wherein $M = \frac{1}{2}N$, and the N input bits must be divided into two equally sized groups for implementation.

A prior art reference to the design of M out of N code checkers occurs in the article EFFICIENT DESIGN OF SELF-CHECKING CHECKERS FOR M-OUT-OF-N CODES by M. A. Marouf and A. D. Friedman occurring in Conference Proceedings for the 1977 IEEE International Conference on Fault-Tolerant Computing at pp. 143-149. A generalized, flow-charted, procedure for the efficient generation and design of M out of N code checkers from logical AND and OR gates is given in this reference. Each of the code checkers so derived is unique, that is it sufficies for a unique N and a unique M. The procedures advanced are indicated to be efficient in terms of hardware cost and the complexity of the design method. For the case of 2M+2 less than or equal to N less than or equal to 4M, M greater than or equal to 2, the preferred realization procedure for the specific case of M=3 and N=8 requires 40 gates. For another specific case wherein N=2M+1, M greater than or equal to 2 (thereby checking an M-out-of-(2M+1) code) the preferred realization procedure develops a checker of 61 gates. The procedures for deriving M out of N code checkers, and the code checker circuits so derived are, in general, multilevel and non-trivial of design implementation.

As a preferred, subcircuit, part to the overall invention of an M out of N code checker circuit, a particular circuit for the generation of berger codes utilizing the exclusive OR logical element, and particularly the Complementary Metal Oxide Semiconductor (CMOS) technology transfer gate element in the realization of such exclusive OR logical element, will be taught. A berger code is defined as the binary encoded number of binary ones occurring between N=3 input signals, and is old in the art. A berger code generator circuit for the binary encoding upon two output signal lines of the number of binary ones occurring upon three input signal lines is trivial of implementation from digital AND, OR, and INVERTER gates and may thusly not be expressly referenced in the prior art of code generator circuits. The preferred embodiment berger code generator circuit to the present invention utilizes an integral exclusive OR logical element implemented from CMOS transfer gates, and not merely the exclusive OR logical function as implemented from the logical elements of AND, OR, and INVERTER gates as occurs in TTL MSI industry standard logic component 86. A preferred prior art reference to the implementation of the exclusive OR (and exclusive NOR) logical element(s) from CMOS transfer gates occurs in U.S. patent application, Ser. No. 355,804 now U.S. Pat. No. 4,477,904 titled Parity Generation/Detection Logic Circuit from Transfer Gates to Lee Thorsrud. An alternative prior art reference to the implementation of the exclusive OR (and exclusive NOR) logical element(s) from CMOS transfer gates occurs in U.S. Pat. No. 4,424,460 issued Jan. 3, 1984 titled APPARATUS AND METHOD FOR PROVIDING A LOGICAL EXCLUSIVE OR-/EXCLUSIVE NOR FUNCTION to David W. Best. A prior art reference to the implementation of the exclusive OR (and exclusive NOR) logical element(s) from transistors occurs in U.S. Pat. No. 4,041,376 issued Aug. 9, 1977 titled HIGH SPEED COMPLEMENTARY OUTPUT EXCLUSIVE OR/NOR CIRCUIT to Barry J. Robinson. This prior art reference teaches the utility of CMOS transfer gates in the generation of parity code bits, but is not concerned with berger codes.

SUMMARY OF THE INVENTION

The present invention of an M out of N code checker circuit and method is a simple, efficient and generalized method and circuit apparatus for checking M out of N codes. A N bit input, control, word is partitioned and the number of binary ones within each partitioned part is counted in a plurality of parallel code generators. In the preferred embodiment of the invention, such partitionment is by groups of three bits and the number of binary ones within each partitioned group of three bits is counted in a circuit called a berger code generator. A preferred embodiment berger code generator circuit—any berger code generator circuit being the preferred but not necessarily the only first stage code generator circuit to the overall N out of M code checker circuit—is a subordinate aspect of the present invention discussed in the next paragraph. Continuing to the second, adder, stage of the N out of M code checker circuit, the counts derived in the code generators are next added in a tree of adders. The resultant sum quantity, the total of all binary ones within the input control word, is finally compared within a last, comparator, stage to an arbitrary M bit count, M less than or equal to N. Any failure of the N bit input control word to have M bits set, such M as may change from utilization cycle to utilization cycle of the present circuit, will result in a detected error signal. The general method and apparatus of the present invention employing a first code generators, a second adders, and a third comparator stage is easily extensible and expansible to any M and N (M less than or equal to N).

The present invention of an M out of N code checker circuit need not utilize as a first stage code generator that berger code generator which operates on a partitioned group of three bits, but may instead utilize a first stage code generators which operate on any partitioned group size of two or more bits. The preferred embodiment code generator stage is, however, comprised of a plurality of berger code generators each operating to produce two binary encoded signals as represent the number of binary ones contained between three input signals. Furthermore, each berger code generator is preferably constructed from exclusive OR logical elements. The preferred implementation of these exclusive OR logical elements (which appear in the preferred logical design of the berger code generator, which appears in the preferred embodiment M out of N code checker circuit) is from the Complementary Metal Oxide Semiconductor (CMOS) transfer gate structure. Therefore the present invention of an M out of N code checker logical circuit also incorporates, as subordinate but separable aspects, a logical design (utilizing XOR logical elements) for a berger code generator and a physical design (based on CMOS technology) for implementing such berger code generator.

Corresponding, within a first class of objects, it is a first object of the present invention that a method and an apparatus for the checking M out of N codes should be taught which is efficient. A preferred embodiment M out of 12 code checker circuit is presented which utilizes four berger code generators, 2 two bit adders, one 3 bit adder, and a comparison stage of four XOR gates and one OR gate for a total of 48 gates, or 4 gates per input. Other extensions and configurations are also of high efficiency.

Within such first class of objects, it is a second objective of the present invention that the number of stages, and the commensurate time delay, of that M out of N code checker circuit taught should be commensurate with the number of stages and time delays of prior art circuits. By comparison with the prior art circuit within the Marouf and Friedman article, for example, wherein a 3 out of 8 code checker is shown as requiring six stages, this objective may be observed to be met in a general manner by the preferred embodiment code checker circuits of the present invention.

Within such first class of objects, it is a third objective of the present invention that the same physical circuitry should suffice, at different times, to check an M out of N bits as M varies from 0 to N. Since certain of the total N input, control, word bits may always be physically connected as binary zeros, such a capability creates a generalized M out of a generalized N code checker circuit apparatus. This is to be contrasted with the discrete and custom generation of prior art unique code checker circuits for at least each N and often, for efficiency, for each M.

Within such first class of objects, it is a fourth object of the present invention, as a subsidiary object to the third object, that the selfsame circuit is utilizable upon a first time to detect a first M, such value M as is supplied by bit count input signals, out of N bits will be utilizable upon a subsequent, second, time to detect a different M, such new value M as is resupplied by bit count input signals, out of N bits. In other words, the physical circuit does not change as the desired M is altered, upon each circuit utilization, from 0 to N. The desired M value is supplied to the circuit of the present invention as bit count input signals. The M bit count, may remain fixed, however, as by hardwiring these bit count input signals. Thus the invention may be used to check Berger coded devices.

Within such first class of objects, it is a fifth object of the present invention that a simple, generalized, design methodology employing code generator, adder, and comparator stages should be given for the generation of M out of N code checkers. By employing this straightforward design methodology an M out of N code checker circuit of any dimension (M less than or equal to N) is readily implementable.

Within such first class of objects, it is a sixth object of the present invention that the actual derived bit count of the N bit input, control word (such bit count as is being compared to be equal to M) should be available to other, further, circuitry as may desire to use such developed quantity. Such an actual developed bit count, allowing recognition potential difference between such and the desired bit count M, has not previously been available from M out of N code checker circuits.

It is a second class of objects of the present invention that a particular berger code generator circuit should be taught. Within such second class of objects, it is a first object that the logical design of a berger code generator receiving three input signals should utilize two exclusive OR logical elements.

Within such second class of objects, it is a second object that the exclusive OR logical element utilized in a berger code generator should be implemented from CMOS technology transfer gates.

It is a third object within such second class of objects that the berger code generator circuit taught should be fully buffered for the receipt of input signals and the driving of output signals, thereby making such berger code generator circuit of general compatibity, utility, and applicability to incorporation within further, larger, logical structures such as M out of N code checker circuits.

BRIEF DESCRIPTION OF THE DRAWINGS

FIG. 1b shows a prior art truth table for the function of the 2-bit code generator circuit of FIG. 1a.

FIG. 2b shows a truth table for the function of the berger code generator circuit shown within FIG. 2a.

DESCRIPTION OF THE PREFERRED EMBODIMENT

Figure 3:
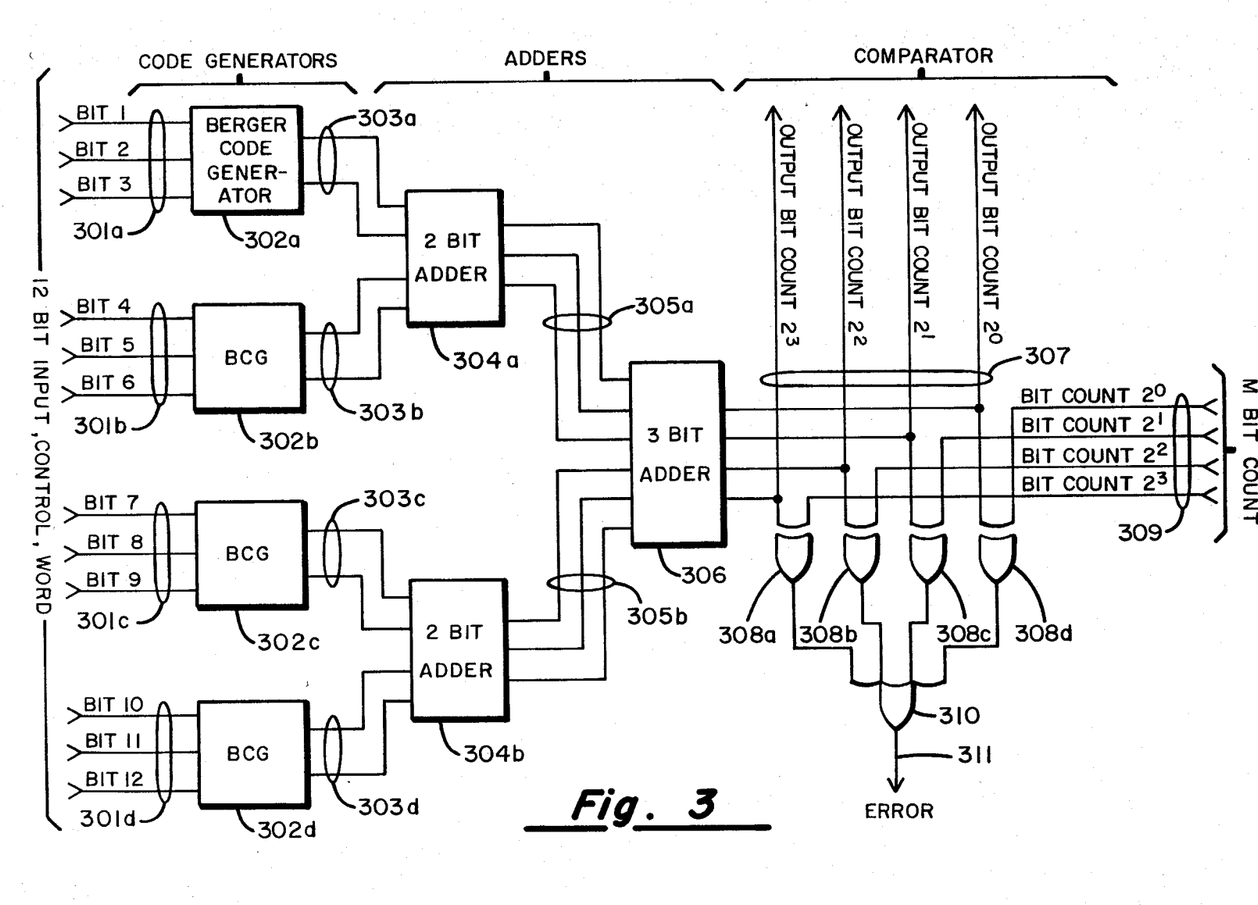
FIG. 3 shows the M out of N code checker circuit of the present invention in one specific, preferred embodiment, N out of 12 form.
Figure 4:
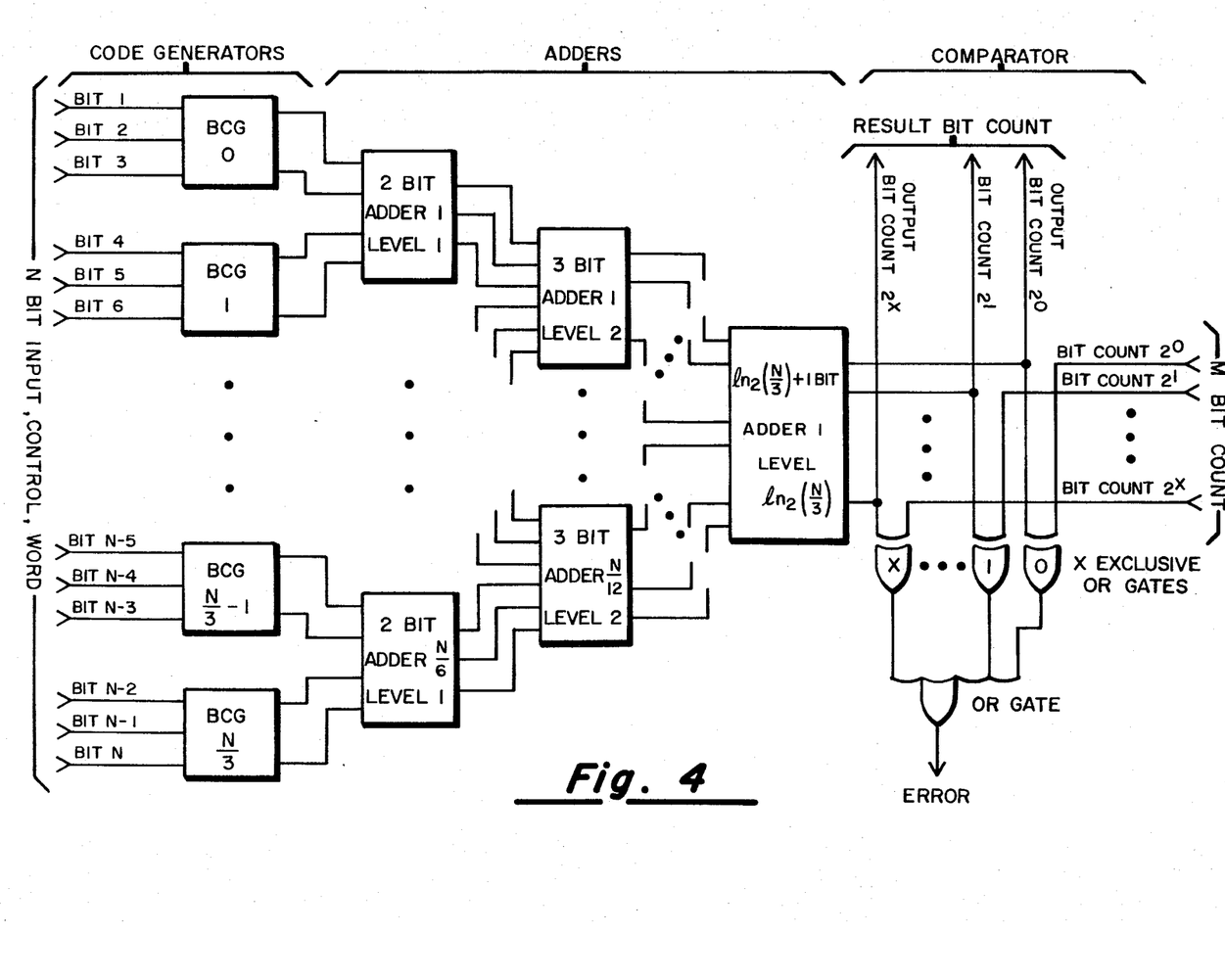
FIG. 4 shows a generalized schematic diagram of the present invention of an M out of N code checker circuit such as can check for a generalized M binary one bits out of an N bit control word, M less than or equal to N.

The present invention of a method and apparatus for M out of N code checking utilizes, by momentary reference to FIG. 3 and FIG. 4, a first stage of code generators such as develop the number of binary ones within each of a plurality of segmented parts of an N bit input control word. A prior art code generator capable of encoding the number of binary ones contained within two input signals is shown in schematic form in FIG. 1a. Signal A and signal B, logically High for a binary one signal and logically Low for a binary zero signal, are received at non-inverting exclusive OR (XOR) gate 102 and at AND gate 104. The XOR gate 102 is logically equivalent to these contained within industry standard part number 136. The AND gate 104 logically corresponds to industry standard part number 08.

Figure 1A:
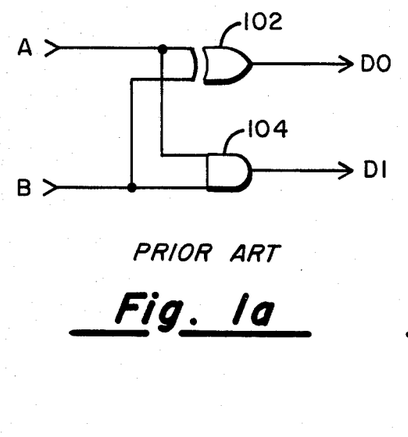
FIG. 1a shows a prior art 2-bit code generator circuit which develops the number of binary one bits as are contained in two input signals, signal A and signal B.
Figure 1B:
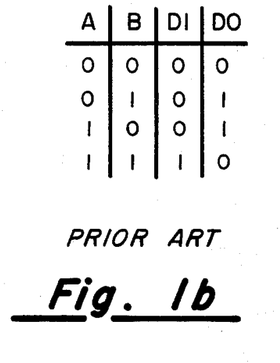

The truth table for the 2-bit code generator circuit shown in schematic form in FIG. 1a is shown in FIG. 1b. The least significant output signal D0 and the most significant output signal D1 transmit the binary encoded value representative of the number of binary ones contained within input signals A and B. The utilization of two output signals, D0 and D1, to express the number of binary one bits contained within two input signals A and B, is not maximally efficient.

Figure 2A:
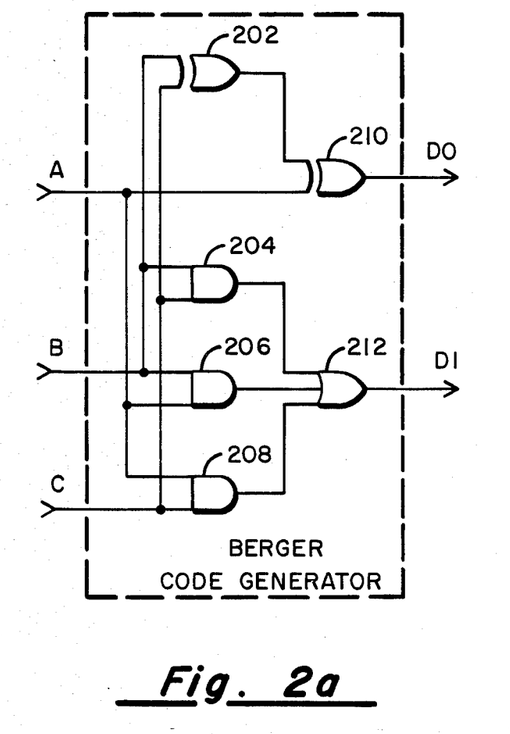
FIG. 2a shows, as a subordinate aspect of the present invention, a preferred embodiment logical schematic for a berger code generator circuit, such circuit as develops binary encoded signals D0 and D1 which represent the number of binary one bits contained within three input signals, signals A through signal C.
Figure 2B:
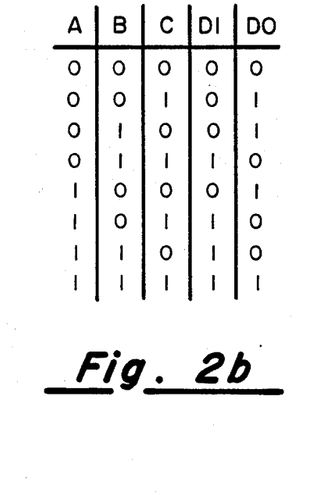

The logical diagram of code generator, called a berger code generator, which is efficient for the purposes of the present invention is shown in FIG. 2a. In a Boolean expression the output of XOR gate 202 is $B \oplus C = \overline{B}C + B\overline{C}$. The output of XOR gate 210, or the least significant encoded signal D0, is represented by the Boolean expression $ABC + A\overline{B}\overline{C} + \overline{A}B\overline{C} + \overline{A}\overline{B}C$. By momentary comparison to the truth table for the function of this berger code generator circuit as shown in FIG. 2b, such a Boolean expression may be observed to be the proper generation of the least significant signal such as represents the number of binary ones contained within the three input signals A, B and C. Similarly, the Boolean representations of the signals developed in AND gates 204, 206, and 208 are respectively BC, AB and AC. The Boolean representation of the most significant encoded output signal, signal D1, as developed in 3 input OR gate 212 (industry standard part number 27 without output inverted in industry standard part number 04) is AB+AC+BC.

Figures 5, 5A:
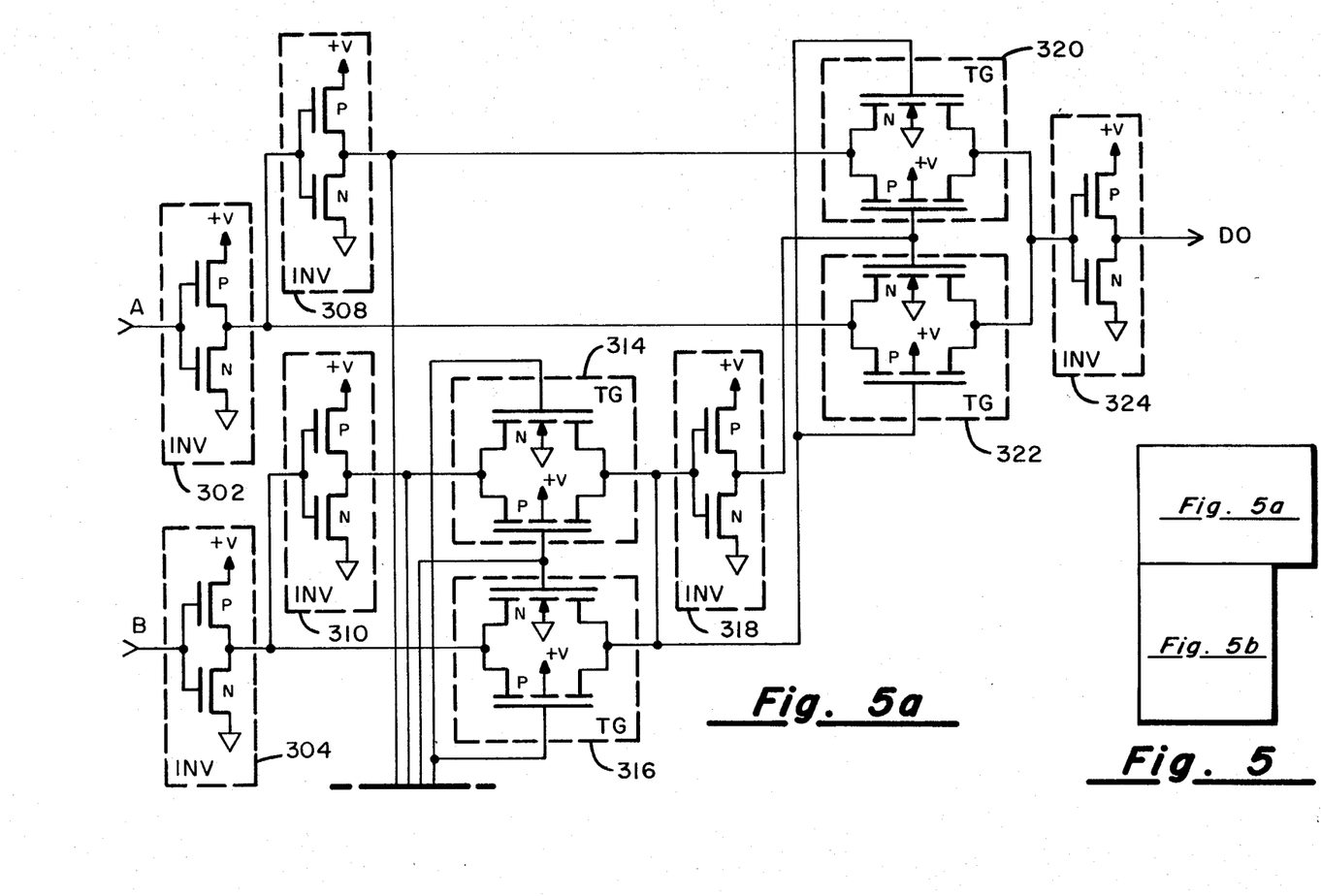
FIG. 5 shows an electrical schematic of the preferred embodiment implementation of the logical circuit of FIG. 2a as implemented in Complementary Metal Oxide Semiconductor technology.
Figure 5B:
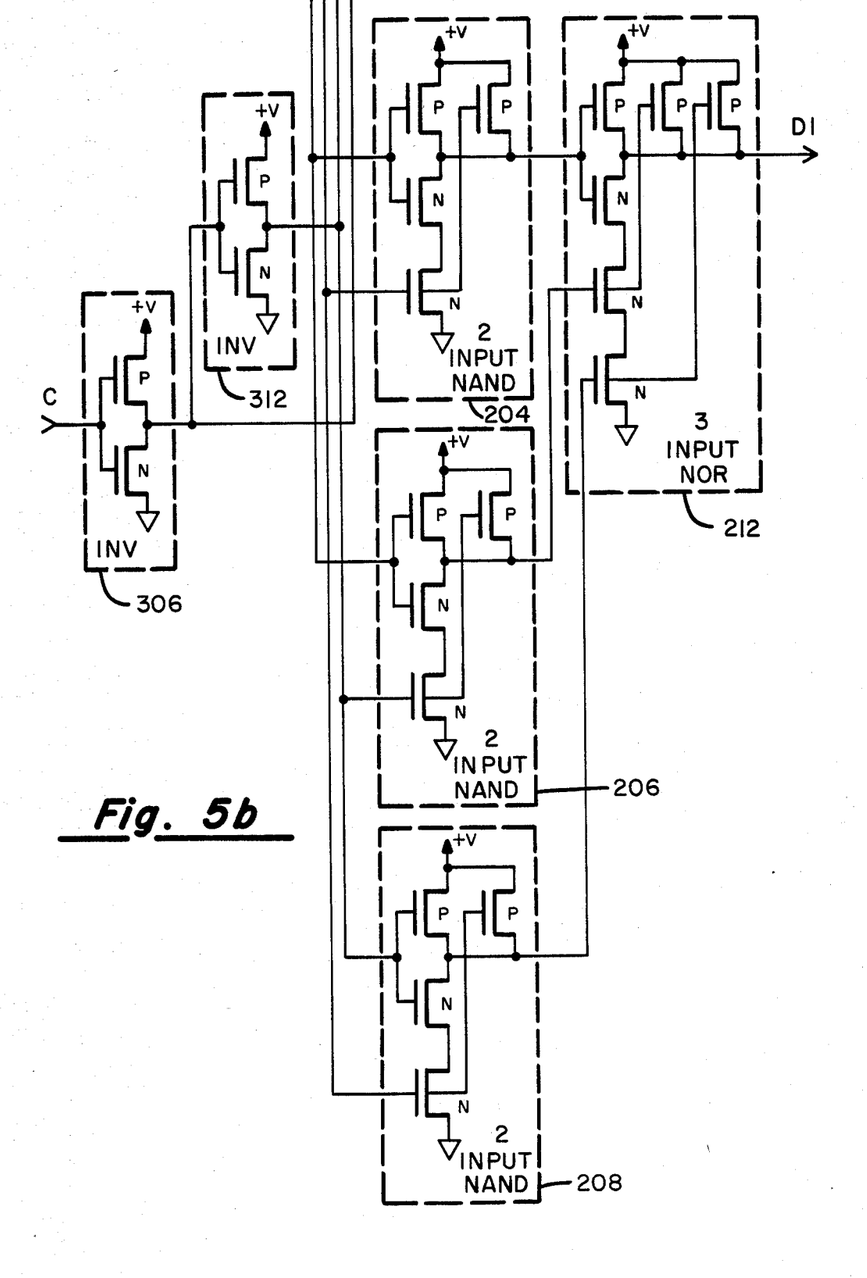

A preferred embodiment electrical schematic for the implementation of the circuit of FIG. 2a in CMOS technology is shown in FIG. 5 and will be later discussed. For the purposes of the method and apparatus for M out of N code checking as illustrated in FIG. 3 and FIG. 4 it is sufficient merely to understand the logical function of the circuit of FIG. 2a.

The truth table expressing the function of the prior art berger code generator circuit shown in FIG. 2a is shown in FIG. 2b. The two signals D0 and D1 are utilized to efficiently express all possible numbers of binary ones (0, 1, 2 or 3) occurring between three input signals (A, B and C). Because of this efficiency in encoding the number of binary ones within a group of signals, this berger code generator circuit as shown in FIG. 2a is employed within the preferred embodiments of the invention. It is not however, necessary to encode in three bit groups to exercise the method of the present invention involving code generator, adder and comparator stages. A plurality of the two bit code generator circuit as shown in FIG. 1a could be utilized as first stage code generators. Similarly, it is possible for a routineer in the art to construct a circuit which counts the number of ones between four and more input signals. The next most efficient grouping to the three signals as are encoded by the berger code generator circuit shown in FIG. 2a would occur at seven input signals, which seven signals would be encoded for the number of binary ones contained therein a three signal output. Such larger encoders are possessed of much more logic than is contained within the berger code generator shown in FIG. 2a. The granularity, or modularity, of that N bit input control word which is received by the circuit of the present invention will also be a function of the number of signals received at each of the code generators. Of course, certain input signal lines may be truncated, or tied to logical zero and unused. The otherwise efficient encoding of seven lines gives a granularity higher than is common in M out of N code check circuit applications. Thusly, for circuit encoding efficiency and for granularity of sizing the berger code generator circuit shown within FIG. 2a will be utilized in the first, code generator, stage of the circuit of the present invention, although the utilization of this particular berger code generator circuit is not mandatory to realize the generalized method and the generalized circuit apparatus of the present invention.

A preferred embodiment of the present invention of an M out of N code checker circuit is shown in schematic form in FIG. 3. The embodiment shown is for an M out of N=12 code checker circuit. The embodiment comprises the three stages of code generators, adders, and a comparator. The M out of 12 code checker circuit shown in FIG. 3 receives from external circuitry as signals BIT 1 through BIT 12 on cables 301a through 301d a 12 bit input, control word at respective berger code generators 302a through 302d. Each of the berger code generators 302a through 302d, such as were previously shown in FIG. 2a, respectively outputs as signals on cables 303a through 303d the binary encoded count of the number of binary ones which were respectively received by such berger code generators 302a through 302d (on respective cables 301a through 301d). The net function of the code generators stage has been to receive a control, input word of a multiplicity of bits (12) in a plurality of groups (4) and within the total bits (3) of each of such plurality of groups to count the number of one bits. This counting is performed within an equal plurality (4) of code generators (berger code generators) in order that the resultant counts may be output upon an equal plurality (4) of groups of binary encoded signal lines (2 each group). Alternatively, it may be said that the code generators stage produces in a plurality of individual code generators an equal plurality of groups of encoded output signals, each group of encoded output signals which respectively represents the number of binary one bits contained within a group of input signals, one of a plurality of such groups as in aggregate comprise the control, input word of a multiplicity of such input signals.

The second stage of the preferred embodiment M out of 12 implementation of the present invention of an M out of N code checker circuit as shown in FIG. 3 is comprised of the adders. The adders, consisting of 2 bit adders 304a, 304b and 3 bit adder 306, are arranged in a binary tree for the collection and summation of the encoded signal outputs (berger codes) arising from the code generators stage. The 2 bit adder 304a sums the 2 bit berger codes respectively received upon cables 303a and 303b from berger code generators 302a and 302b and produces three output signals on cable 305a which are received at 3 bit adder 306. Similarly 3 bit adder 304b sums the berger code signals respectively received on cables 303c and 303d from berger code generators 302c and 302d in order to formulate 3 output signals upon cable 305b which are received at 3 bit adder 306. The 2 bit adders 304a and 304b can be considered to comprise a first level, level 1, of a binary tree of such adders which will be utilized in the summation of the total number of binary one bits contained within the 12 bit input, control word. In the M out of 12 code checker preferred embodiment circuit shown in FIG. 3, the level 2 adder, 3 bit adder 306, is the root node adder of the binary tree of such adders. The 3 bit adder 306 receives the signals on lines 305a and 305b as are representative of partial addends of the number of binary one bits within the 12 bit control word and formulates a final output count of such number of binary ones as signals OUTPUT BIT COUNT $2^0$ to OUTPUT BIT COUNT $2^3$ on cable 307. Such signals are available to other, external circuitry as an indication of the total number of binary one bits which were present within the input 12 bit control word.

The final stage of the present invention of an M out of N code checker circuit is the comparator stage shown in FIG. 3. Such comparator stage receives as the second external input to the present circuit signals BIT COUNT $2^0$ through BIT COUNT $2^3$ on cables 309 as the M BIT COUNT. Such an M BIT COUNT is the externally supplied, binary-encoded, signal representation of that number of bits M which are desired, and expected, to be present within the 12 bit control word. The origin of such signals can be static as each of the lines within cable 309 is permanently connected to a logical Low (false or 0) or logical High (true or 1) condition. Alternatively, such signals M BIT COUNT can be dynamically established during each utilization of the present M out of N code checker circuit for each of a possibly successive plurality of 12 bit input, control words.

Continuing in FIG. 3, signals OUTPUT BIT COUNT $2^3$ through OUTPUT BIT COUNT $2^0$ on cable 307 are respectively compared with signals BIT COUNT $2^3$ through BIT COUNT $2^0$ on cable 309 in XOR logical circuits 308a through 308d. If one or more signal pairs fail to match (be equal), indicating that the number of detected binary one bits within the 12 bit input, control word is not equivalent to that number M of bits expected to be set as binary encoded in the M BIT COUNT signals, then the logical High signal resultant from one(s) of XOR circuits 308a through 308d will satisfy 4 input OR gate 310 producing the logical High or true, condition of signal ERROR on line 311. Such signal ERROR on line 311 is the primary output of the present M out of 12 code checker circuit, and is normally utilized by external circuitry as an indication that a 12 bit input, control, word has failed to exhibit the required number of binary one bits in the logical true, or set, condition. The total M out of 12 code checker circuit as shown in FIG. 3 has utilized 4 berger code generators previously shown in FIG. 2a. Two 2-bit binary full adders, industry standard part number 82, and one 3-bit adder, industry standard part number 83, were utilized. Finally, four 2-input XOR gates, industry standard part number 136 and one 4-input positive OR gate, industry standard part number 25 with grounded strobe and with output inverted by industry standard part number 05, were utilized in the comparator stage. The total number of gates utilized within the M out of 12 code checker circuit shown in FIG. 3 is 48, or 4 gates for each bit of the 12 bit input, control word.

The generalized schematic representation of the expansible and extensible M out of N code checker circuit of the present invention is shown in FIG. 4. The circuit consists of a first stage of code generators, a second stage of adders, and a third comparator stage. Signals representing an N BIT INPUT, CONTROL, WORD received on a multiplicity of signal lines are divided into a plurality of groups for encoding in a like plurality of code generators. When each group of signals of such plurality of signal groups as subtend said multiplicity of signals is in number equal to three such signals, then the code generators are of the berger code generator type. In such a case, the total number of such plurality of berger code generators would be equal to the multiplicity N of received input signal lines divided by three, or N/3. Berger code generators are not the sole and exclusive type which will suffice to encode the N BIT INPUT, CONTROL, WORD as contained upon a multiplicity N of signal lines. For example, the two bit encoder circuit shown within FIG. 1a could be utilized alternatively to berger code generators. For the case of encoding at a group granularity other than three signals, the requisite number of first and following stage adders as contained within the binary adder tree must be in conformance with the total number of encoded signals to be summed.

The second stage of the generalized representation of the M out of N code checker circuit as shown in FIG. 4 consists of the adders. Such adders are arranged in a binary tree from level 1 to level $\ln_2(N/3)$. Such adders progress in bit width from 2 bits at level 1 to $\ln_2(N/3)+1$ bit at level $\ln_2(N/3)$. The final adder develops signals OUTPUT BIT COUNT $2^0$ through OUTPUT BIT COUNT $2^X$ as the RESULT BIT COUNT on $X+1$ signal lines, where $2^{X+1}$ is greater than or equal to N. The RESULT BIT COUNT is the binary encoded number of binary one signals as were present within the N BIT INPUT, CONTROL, WORD.

Continuing in FIG. 4, the generalized final comparator stage compares the $X+1$ RESULT BIT COUNT signals with the externally supplied signals BIT COUNT $2^0$ through BIT COUNT $2^X$ collectively comprise the binary encoded M BIT COUNT. The binary encoded M BIT COUNT is the number of binary ones which are desired to be tested to be set within the original N BIT INPUT, CONTROL, WORD, wherein such number M is less than or equal to the number N. The comparison between signals M BIT COUNT and signals RESULT BIT COUNT is accomplished in X exclusive OR gates, $2^X$ greater than or equal to N greater than or equal to M, and the comparison results from such X exclusive OR gate are collected in an OR gate (or tree of OR gates) for development of the ERROR signal. Thusly, in a generalized method involving code generation in code generators, addition in adders, and comparison in exclusive OR gates with the collection of such comparison results within an OR gate (or OR gate network tree), the generalized detection of M bits, such M as is input to the present circuit in binary encoded signals, may be detected for an N BIT INPUT, CONTROL, WORD, such word as is input to the present circuit as N binary signals. The present M out of N code checker circuit produces, primarily, an ERROR signal in the eventuality that the specified M is not the number of binary one bits detected within the N BIT INPUT, CONTROL, WORD and secondarily, binary encoded signals representative of the actual number of binary one bits which are detected within such N BIT INPUT, CONTROL, WORD.

As a subordinate and separable aspect of the present invention, the berger code generator circuit for which the logical schematic is shown in FIG. 2a has a preferred embodiment electrical implementation based in Complementary Metal Oxide Semiconductor (CMOS) technology, including most particularly the transfer gate structure of that technology. The electrical schematic of the preferred embodiment implementation of the berger code generator circuit shown in FIG. 2a is shown in FIG. 5. The berger code generator circuit, and, indeed, the entire M out of 12 code checker circuit, is capable of implementation as monolithic large scale integrated circuitry. The CMOS structures shown in the electrical schematic diagram of FIG. 5 are preferred for such an implementation. Certain common CMOS structures such as 2 INPUT NAND gates 204, 206 and 208 plus 3 INPUT NOR gate 212 may be directly correlated with the logic elements shown in FIG. 2a. The three inverter pairs INV 302 plus INV 308, INV 304 plus INV 310, and INV 306 plus INV 312 respectively buffer the input signals A, B and C. This input buffering, and also the buffering of the D0 output signal as occurs in INV 324 is a matter of design convention. In particular, such a design convention requires that CMOS transfer gates such as are represented by TG 314, TG 316, TG 320 and TG 322 should neither directly receive signals from, nor directly drive signals to, CMOS junctions which are electrically remote. This is because a transfer gate is a passive electrical element, without current gain. If the gate input junction to a transfer gate electrically oscillates, or rings, more than one CMOS diode drop, or +V, above the signal input junction the transfer gate can produce invalid results.

The function and interconnect of the transfer gates TG shown in FIG. 5 to accomplish the exclusive OR logical function is explained in U.S. patent application Ser. No. 355,804 now U.S. Pat. No. 4,477,904 titled Parity Generation/Detection Logic Circuit from Transfer Gates to Lee Thorsrud. The entirety of that application is incorporated by reference. An alternative prior art implementation of the exclusive OR/exclusive NOR logical function from CMOS transfer gates is taught in U.S. Pat. No. 4,424,460 titled APPARATUS AND METHOD FOR PROVIDING A LOGICAL EXCLUSIVE OR/EXCLUSIVE NOR FUNCTION to David W. Best, the contents of which are incorporated herein by reference. The transfer gate structure itself is explained in the text Basic Integrated Circuit Engineering by D. Hamilton and W. Howard c 1978 by McGraw Hill, Inc. at pages 549 through 566. In the electrical schematic of FIG. 5, the N-channel transistor is shown to be connected to (voltage level) ground, which voltage is sometimes called $V_{SS}$ for voltage, substrate. The P-channel transistor within transfer gate TG 314 is shown to be connected to voltage V+, which is the supply voltage nominally 3 volts d.c. and which voltage is sometimes (in conjunction with transfer gate structures) called $V_{DD}$. Like labeled (INV, TG, and 2 INPUT NAND) CMOS structures shown in FIG. 5 are electrically identical. The total number of junctions required in the preferred embodiment CMOS implementation of the berger code generator circuit shown in FIG. 5 is 42. The maximum number of propagation stage delays is seven.

The berger code generator means shown in FIG. 5 contains first and second exclusive OR gates, each performing the exclusive OR logical function between a first (B) and a second (C) input signal. Each first and second exclusive OR gate further physically comprises: first, second, third and fourth CMOS technology P-N transistor pair inverter buffers INV 304, INV 310, INV 306, and INV 312 which provide buffered (B,C) and inverted ($\overline{B},\overline{C}$) ones of both said two input signals (B,C); a first CMOS technology transfer gate TG 314 which is input by said inverted form of said first signal ($\overline{B}$), which is gated in the P channel transistor by said inverted form of said second signal ($\overline{C}$), which is gated in the N channel transistor by said buffered normal form of said second signal (C), which transfers an output signal which is wired-OR connected to the output signal of a second CMOS technology transfer gate TG 316 which is input by said buffered normal form of said first signal (B), which is gated in the P channel transistor by said buffered normal form of said second signal (C), and which is gated in the N channel transistor by said inverted form of said second signal ($\overline{C}$); and a fifth CMOS technology P-N transistor pair inverter buffer INV 318 which receives said wired-OR connected output signal of said first transfer gate and said second transfer gate, and which produces, as the inversion of such received wired-OR signal, the exclusive OR logical function ($B+C=B\overline{C}\oplus\overline{B}C$) as between said two input signals (B, C). Since said first through said fifth CMOS technology P-N transistor pair inverter buffers merely invert and amplify signals, the actual exclusive OR logical function may be observed to be accomplished in the connections to and interconnection of said first and said second CMOS technology transfer gates TG 314 and TG 316.

While a specific preferred embodiment of the invention has been described in detail as an M out of 12 code checker circuit wherein the code generators are specifically implemented as berger code generators, it will be understood that the basic principles of the invention may be utilized in alternative manners and configurations. Furthermore, although the invention has been particularly shown and described with reference to the preferred embodiments thereof, it will be understood by those skilled in the art that various alterations in form and detail may be made therein without departing from the spirit and scope of the invention. For example, and has been noted since the alternative code generator forms in FIG. 1a and FIG. 2a were first discussed, it is not requisite that the first stage code generators need be berger code generators for the employment of the method of the present invention. It is sufficient only that the adders stage should collect, and properly sum, the output of the code generators such as collectively count the ones within variously granularized groups of the entire N BIT INPUT, CONTROL, WORD. For example, the comparator stage could consist of X exclusive NOR gates with the comparison signals collected in a NAND gate for development of the ERROR SIGNAL.

Similarly, a preferred embodiment of a berger code generator circuit has been described as implemented within exclusive OR logical elements based on the CMOS technology transfer gate structure. Various alterations in the form and detail of this embodiment could be made without departing from the spirit and scope of the disclosure. For example, the exclusive

11

NOR logical element, which is also realizable with CMOS transfer gate, could have similarly been utilized.

What is claimed is:

1. An M out of N code checker circuit apparatus for determining if number M bits, where $M \leq N$ and where such number M as is received by said circuit as binary-encoded first signals, is equal in number to that number of binary ones as between N binary input second signals, said circuit apparatus comprising:

code generator stage means for receiving said N binary input second signals in a plurality of parts, and for producing for each of said plurality of parts binary-encoded third signals representing the number of binary ones contained between the input signals of each respective part;

adder stage means for gathering all said binary-encoded third signals as are produced by said code generator means for each respective one of said plurality of parts, from said code generator stage means and for adding said binary-encoded third signals in order to produce as binary-encoded fourth signals that total binary ones bit count as is contained between said N binary input second signals; and comparator stage means for receiving said binary-encoded fourth signals which represent the total binary ones bit count from said adder stage means, and for receiving said binary-encoded first signals which represent the number M, and for producing an error signal if said binary-encoded fourth signals and said binary-encoded first signals are not equal;

whereby said error signal results if said total binary ones bit count between said N binary input signals was not equal in number to M;

whereby said circuit apparatus thusly checks an M out of N code between said N binary input signals for any number $M \leq N$.

2. The circuit apparatus of claim 1 wherein said code generator stage means further comprises:

berger code generator means of number (that least integer number $\geq$) N/3 for each receiving 3 of said N binary input second signals (including receiving within the last of said berger code generators sufficient binary zero signals, if required, so as to total 3 signal inputs to said last of said berger code generators), and for each producing 2 binary-encoded third signals representing the number of binary ones contained between said 3 input second signals received by each.

3. The circuit apparatus of claim 2 wherein said adder stage means further comprises:

binary adder tree means for gathering in each of N/6 total first level adders, each of 2 bit width 2 groups of said 2 binary-encoded third signals as are produced by 2 of said berger code generators, and for adding in a binary tree of adders of $\ln_2(N/6)$ levels said binary-encoded third signals until a single root node adder of $(\ln_2(N/3)+1)$ bit width produces as $(x+1)$ binary-encoded fourth signals, $2^{x+1} \geq N$, that total binary ones bit count as is contained between said N binary input second signals.

4. The circuit apparatus of claim 3 wherein said comparator stage means further comprises:

$(x+1)$ exclusive OR gate means for respectively receiving said $(x+1)$ binary-encoded fourth signals and said binary-encoded first signals and for producing $(x+1)$ fifth signals as represent the exclusive OR logical function as between respective ones of said fourth signals and said first signals; and OR gate means for receiving said $(x+1)$ fifth signals and for producing an error signal if any one or ones of said fifth signals are logically true;

whereby since the exclusive OR logical function produces the logically true condition only for inequality as between two logical inputs, then said error signal indicates that said fourth signals and said first signals are not equal.

5. The code generator stage means of claim 2 wherein each said berger code generator means further comprises:

first, second, and third AND gate means for respectively receiving a first (B) plus a second (C), a first (B) plus a third (A), and a second (C) plus a third (A) of said 3 of said N binary input second signals, and for each respectively producing as a respective one of three fifth signals the logical AND function between the respective received two of said input second signals;

OR gate means for receiving said three fifth signals, and for producing as the most significant signal one of said 2 binary-encoded third signals the logical OR function of said three fifth signals;

first exclusive OR gate means for receiving a first (B) plus a second (C) of said 3 of said N binary input second signals, and for producing as a sixth signal the exclusive OR logical function between said first two signals; and second exclusive OR gate means for receiving a third (A) of said 3 of said N binary input second signals plus said sixth signal, and for producing, as the least significant signal one of said 2 binary-encoded third signals, the exclusive OR logical function between said third (A) signal and said sixth signal.

6. The berger code generator means of claim 5 wherein each said first and said second exclusive OR gate means, as each performs the exclusive OR logical function between a first (B) and a second (C) input signal, further physically comprises:

first, second, third and fourth CMOS technology P-N transistor pair inverter buffers which provide buffered (B, C) and inverted ($\overline{B},\overline{C}$) ones of both said two input signals (B, C);

a first CMOS technology transfer gate which is input by said inverted form of said first signal ($\overline{B}$), which is gated in the P channel transistor by said inverted form of said second signal ($\overline{C}$), which is gated in the N channel transistor by said buffered normal form of said second signal (C), which transfers an output signal which is wired-OR connected to the output signal of a second CMOS technology transfer gate which is input by said buffered normal form of said first signal (B), which is gated in the P channel transistor by said buffered normal form of said second signal (C), and which is gated in the N channel transistor by said inverted form of said second signal ($\overline{C}$); and a fifth CMOS technology P-N transistor pair inverter buffer which receives said wired-OR connected output signal of said first transfer gate and said second transfer gate, and which produces, as the inversion of such received wired-OR signal, the exclusive OR logical function ($B \oplus C = B\overline{C} + \overline{B}C$), as between said two input signals (B, C);

whereby since said first through said fifth CMOS technology P-N transistor pair inverter buffers merely invert and amplify signals, the actual exclusive OR logical function may be observed to be accomplished in the connections to and interconnection of said first and said second CMOS technology transfer gates.

7. The M out of N code checker circuit apparatus of claim 1 wherein said binary-encoded first signals are hardwired;
  thereby specifying an invariant number M;
  whereby said M out of N code checker circuit is thusly for code checking of a single particular M of a plurality of M out of N codes, $M \leq N$;
  whereby said fixed M out of N code checker circuit is useful for error checking of circuit devices operative with a fixed M out of N fault detection code.

* * * * *